US007033932B2

(12) United States Patent
Kim

(10) Patent No.: US 7,033,932 B2
(45) Date of Patent: Apr. 25, 2006

(54) METHOD FOR FABRICATING A SEMICONDUCTOR DEVICE HAVING SALICIDE

(75) Inventor: Jea-Hee Kim, Kyungki-do (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/919,954

(22) Filed: Aug. 16, 2004

(65) Prior Publication Data

US 2005/0048750 A1 Mar. 3, 2005

(30) Foreign Application Priority Data

Sep. 1, 2003 (KR) ...................... 10-2003-0060925

(51) Int. Cl.
*H01L 21/44* (2006.01)

(52) U.S. Cl. ...................... 438/655; 438/663; 438/664; 438/682

(58) Field of Classification Search ................ 438/592, 438/655, 663, 664, 682
See application file for complete search history.

(56) References Cited

U.S. PATENT DOCUMENTS 5,946,573 A * 8/1999 Hsu ........................... 438/275
6,008,077 A * 12/1999 Maeda ....................... 438/151
6,025,267 A * 2/2000 Pey et al. ................... 438/656
6,063,706 A * 5/2000 Wu ........................... 438/682
6,100,161 A 8/2000 Yu et al.
6,156,593 A * 12/2000 Peng et al. ................. 438/200
6,265,271 B1 7/2001 Thei et al.
6,277,683 B1 * 8/2001 Pradeep et al. ............. 438/200
6,468,904 B1 * 10/2002 Chen et al. ................. 438/682

* cited by examiner

*Primary Examiner*—Trung Dang
(74) *Attorney, Agent, or Firm*—Andrew D. Fortney

(57) ABSTRACT

The present invention can protect from degradation of product reliability of a semiconductor caused during formation of a salicide suppression layer. In order to achieve this, unlike the conventional method in which the sidewall spacer of the gate electrode and the salicide suppression layer in the non-salicide region are formed through two etching processes, the salicide suppression layer and the sidewall spacer are formed at the same time with one etching process after the salicide suppression substance and the sidewall spacer substance are sequentially formed in the present invention, such that it is possible to efficiently prevent an undercut effect from occurring at the spacer side during the etching process for forming the salicide suppression layer, and to effectively prevent the surface of the semiconductor substrate from being damaged.

21 Claims, 6 Drawing Sheets

(BACKGROUND)

(BACKGROUND)

(BACKGROUND)

(BACKGROUND)

(BACKGROUND)

(BACKGROUND)

METHOD FOR FABRICATING A SEMICONDUCTOR DEVICE HAVING SALICIDE

BACKGROUND OF THE INVENTION (a) Field of the Invention

The present invention relates to a method for fabricating a semiconductor device, and in particular, to a method for fabricating a semiconductor having salicide that is capable of reducing contact resistance and sheet resistance so as to improve signal speed of a product.

(b) Description of the Related Art

Typically, in the case of selectively forming a salicide region for maintaining a signal speed of a semiconductor device, even though the transistor at the logic core region is formed to below 0.25 μm by means of a salicide process, a non-salicide process is needed at the input/output terminal regions requiring an ESD protection circuit.

In this case, non-salicide regions are formed at a diffuse layer between the source/drain contact, and salicide regions are formed on other regions (contact regions) of the diffuse layer and on the gate electrode for decreasing resistances (contact resistance at the diffuse layer and sheet resistance at the gate), in general.

Also, among nonvolatile devices such as a flat cell-type mask ROM or an EEPROM, various techniques using the BN+ (Buried N+) diffused layer as the source/drain layer at memory cell regions before the gate formation process are used. In addition, in a SOC trend in which memory and logic processes are implemented in a single chip, such nonvolatile devices may be implemented on the basis of the logic process which typically includes a salicide process.

FIGS. 2A to 2F are drawings illustrating processes for fabricating a semiconductor device having salicide according to a conventional method.

As shown in FIG. 2A, a silicon dioxide substance and electrode substance (i.e., polycrystalline silicon) are sequentially deposited on a p-type semiconductor substrate.

Next, an etching mask is formed by depositing a photosensitive substance on the electrode substance and forming an etching mask with a photolithography process in order for the photosensitive substance to be selectively left at the areas on the gate electrode to be formed. The electrode substance and silicon dioxide substance are selectively etched out with the etching mask such that the gate silicon dioxide 204 and the gate electrode 206 are formed on the semiconductor substrate 202 in a predetermined pattern.

Here, reference numeral A denotes a region on which the salicide layer is to be formed through following processes, and reference numeral B denotes a non-salicide region.

Next, as shown in FIG. 2B, a buffer layer 208, such as a silicon dioxide layer, is formed on the semiconductor after the gate electrode 206 is formed. Sequentially, a low concentration impurity region 210 is formed on the semiconductor substrate 202 by injecting a low concentration of n-type dopant ions using the gate electrode as a mask and performing the drive-in. Next, as shown in FIG. 2C, a spacer 212 is formed on a side wall of the gate electrode 206 by forming a thin film substance (silicon dioxide or nitride film) on the semiconductor substrate including the gate electrode 206 and etching back the thin film substance.

At this time, an upper surface of the gate electrode 206 and the low concentration impurity region 210 on which the spacer 212 is not coated are exposed. Also, a source/drain 214 is formed by injecting an impurity using the gate electrode and the spacer 212 as the mask.

Next, as shown in FIGS. 2D and 2E, a thin layer for suppressing a formation of the salicide at the non-salicide region B so as to distinguish the salicide region A and the non-salicide region B is formed.

In more detail, a photosensitive layer 218 is selectively formed only on the non-salicide region B through the photolithography process after forming the salicide suppression substance (nitride film or silicon dioxide) on the whole surface of the semiconductor substrate 202.

Consequently, the salicide suppression layer 216 is selectively formed only on the non-salicide region B by removing the residual photosensitive film after removing the salicide suppression substance at the region (salicide region A) on which the photosensitive film 218 is not formed, by performing a wet or dry etching process using the photosensitive film 218 as the mask.

Next, as shown in FIG. 2F, a metal substance is formed on the entire surface of the semiconductor substrate 202, and then the metal substance on the salicide region A is salicided by performing a thermal annealing process under predetermined process conditions.

In more detail, the metal substance formed on the salicide suppression layer 216 (i.e., the metal substance formed on the non-salicide region B) is kept as it was, and on the other hand, the metal substance formed on the silicon (i.e., the metal substance formed on the salicide region A) reacts with the silicon so as to be salicided. That is, the salicide is formed on the upper surface of the gate electrode 205 and the upper surface of the low concentration impurity region 210.

Finally, the metal substance on the non-salicide region B is removed through a metal substance removal process such that the semiconductor device having the salicide is completely manufactured.

In the conventional method for fabricating semiconductor devices having salicide, the photosensitive layer is selectively formed on the non-salicide region(s) B for forming the salicide suppression layer 216 on the non-salicide region B, and then the salicide suppression substance formed on the salicide region A is removed through a wet or dry etching process. However, the conventional method has a drawback in that undercuts occur to the side of the spacer 212 by the chemical used for the wet etching, for example the undercuts 220*a* and 220*b* shown in FIG. 2D, resulting in degradation of the reliability of the semiconductor device.

Also, in the case of removing the salicide suppression substance formed on the salicide region A by means of wet etching according to the conventional method, as shown in FIG. 2E, there can be a problem in that the semiconductor substrate 202 is damaged with defects 222*a* and 222*b* that are formed on the surface, resulting in degradation of the reliability of the semiconductor devices.

SUMMARY OF THE INVENTION

The present invention has been made in an effort to solve the above problems, and an object of the present invention is to provide a method for fabricating a semiconductor device having salicide that is capable of improving the reliability of the semiconductor device by forming the salicide suppression layer without damaging the semiconductor device.

To achieve the above object, a method for fabricating a semiconductor device (such as a chip, die, monolithic integrated circuit or wafer) having salicide and non-salicide regions, according to the present invention, comprises forming a gate silicon dioxide and a gate electrode on a semiconductor substrate, forming a low concentration impurity region on the semiconductor substrate through an ion injection process using the gate electrode as a mask, depositing a dielectric film spacer substance as a salicide suppression layer on an entire surface of the semiconductor substrate, forming a spacer on a sidewall of the gate electrode by depositing a photosensitive film on a non-salicide region as a etching protection layer and etching out the dielectric spacer substance on the salicide region, forming a salicide suppression layer made of the dielectric film spacer by removing the photosensitive film, and forming salicide on an active region on the salicide region using a metal substance through a thermal annealing process.

Here, the dielectric spacer substance may be formed at a thickness of approximately 1000 Å.

Also, the dielectric spacer substance may comprise two layers, a first dielectric spacer substance and a second dielectric spacer substance, the first spacer substance being formed in a thickness range of approximately 100–350 Å, and the second dielectric spacer substance being formed in a thickness range of approximately 650–900 Å. Generally, the second dielectric spacer substance is different from the first dielectric spacer substance.

Also, the first dielectric spacer substance may be formed in a temperature range of approximately 650–730° C., and the second dielectric spacer substance may be formed in a temperature range of approximately 700–800° C.

One key feature of the present invention is that the salicide suppression layer and the sidewall spacer are formed at the same time through a single etching process, even when the salicide suppression substance and the sidewall spacer substance are separately and/or sequentially formed.

DETAILED DESCRIPTION OF THE PREFERRED EMBODIMENTS

Preferred embodiments of the present invention will be described in detail hereinafter with reference to the accompanying drawings.

FIGS. 1A to 1E are sectional views for illustrating processes for fabricating a semiconductor device having salicide according to a preferred embodiment of the present invention.

Figure 1A:
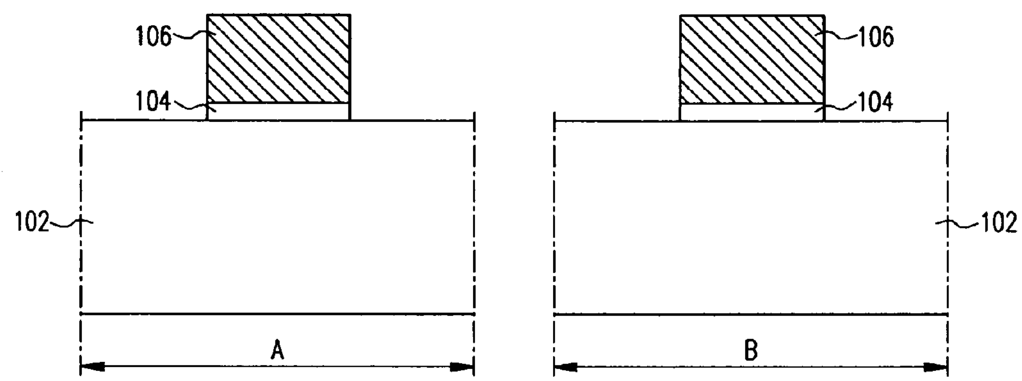
FIGS. 1A to 1E are drawings illustrating respective processes for fabricating a semiconductor device having salicide according to a preferred embodiment of the present invention.

As shown in FIG. 1A, a gate oxide substance (e.g., silicon dioxide) and an electrode substance (e.g., polycrystalline silicon) are sequentially deposited on a p-type semiconductor substrate 102. Next, an etching mask is formed by forming a photosensitive substance on the upper surface of the electrode substance and performing a photolithography process such that the photosensitive substance is left on the area on which the gate electrode is to be formed through the following processes. The electrode substance and the silicon dioxide substance are selectively etched out using the etching mask and then the etching mask is removed, such that the gate oxide 104 and the gate electrode 106 are formed.

Here, a left portion denoted by reference numeral A is an area or region of the semiconductor device in which the salicide is formed through the following processes (the "salicide region"), and a right portion denoted by reference numeral B is a non-salicide area or region of the semiconductor device (the "non-salicide region").

Figure 1B:
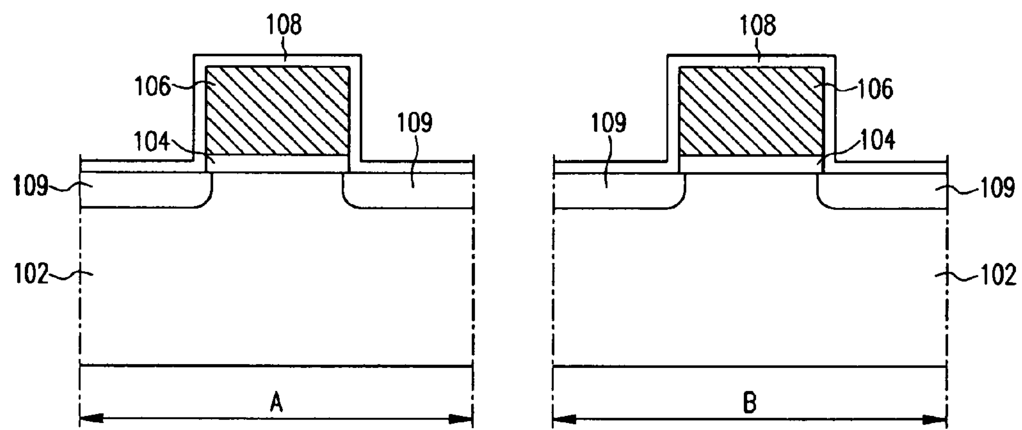

Next, as shown in FIG. 1B, a buffer layer 108 of silicon dioxide is formed on the semiconductor substrate 102 having the gate electrode 106. Also, a low concentration impurity region 109 is formed by injecting and driving in n-type impurity ions to the semiconductor substrate 102 using the gate electrode as a mask. These two steps may be performed in either order, but in one embodiment, buffer layer 108 is deposited before low concentration impurity regions 109 are formed.

Figure 1C:
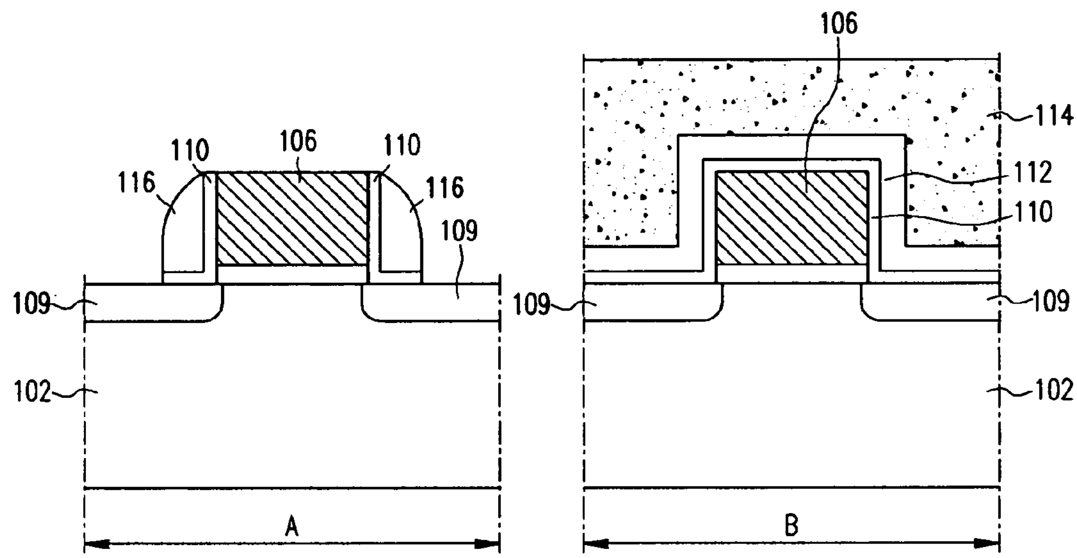

After removing the buffer, as shown in FIG. 1C, a salicide suppression substance 110 and a spacer substance 112 are sequentially deposited on the entire surface of the semiconductor substrate 102 having the gate electrode 106. Also, a photosensitive film 114 is selectively formed on the non-salicide region B by photolithography.

Sequentially, a spacer 116 is formed on a sidewall of the gate electrode 106 located in the region in which the photosensitive film 114 is not covered (salicide area A) by performing a wet or dry etching process using the photosensitive film as a mask. Assuming that the spacer 116 is a first dielectric spacer, the salicide suppression substance acts as a second dielectric spacer. Here, the second dielectric spacer preferably comprises a silicon nitride film if the first dielectric spacer comprises silicon dioxide; on the other hand, the second dielectric spacer preferably comprises silicon dioxide if the first dielectric spacer comprises silicon nitride. Also, the spacer can be formed as an integrally structured dielectric spacer with a single nitride or oxide (e.g., silicon dioxide) film.

For example, when the first dielectric spacer and the second dielectric spacer are formed with respective silicon dioxide (e.g., TEOS) and nitride films, the first dielectric spacer is deposited in a thickness range of approximately 100–350 Å and in a temperature range of approximately 650–730° C., and the second dielectric space is formed in a thickness range of approximately 650–900 Å in a temperature range of approximately 700–800° C. Preferably, the sum of the thicknesses of the first dielectric spacer and the second dielectric spacer is approximately 1000 Å, although it may be more or less. In advanced semiconductor manufacturing technologies (e.g., 0.13 μm, 90 nm, 65 nm), the thicknesses of the first and second dielectric spacers (as well as the sum of these thicknesses) may be expected to decrease.

That is, unlike the conventional method in which the sidewall spacer of the gate electrode and the salicide suppression layer in the non-salicide region are formed through two separate etching processes, in the present method, the salicide suppression layer and sidewall spacers are formed in the same steps with one etching process after the salicide suppression substance and the sidewall spacer substance (which can comprise two layers, or a single layer such as a nitride film sidewall spacer material which can be utilized for both the salicide suppression layer and the sidewall spacer) are formed in the present invention, such that it is possible to technically solve the problems of the conventional method.

Figure 1D:
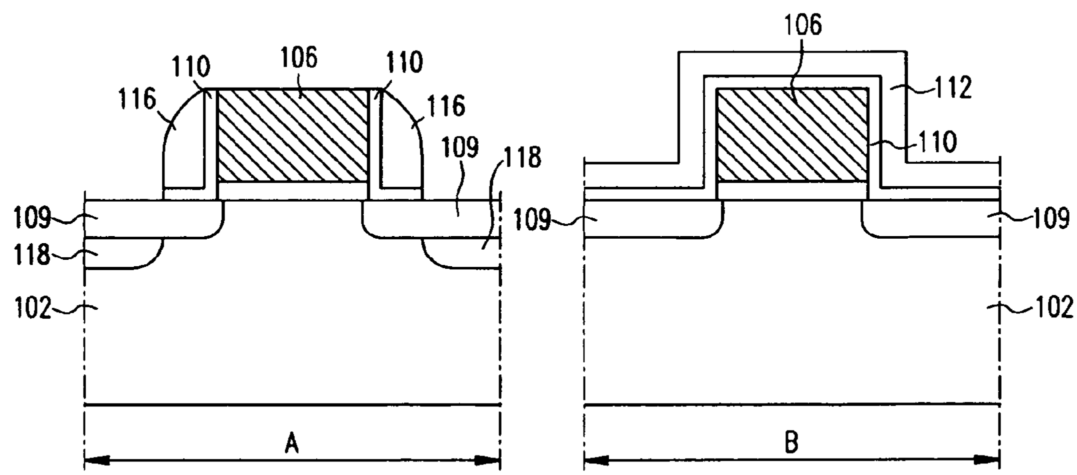

Next, as shown in FIG. 1D, a salicide suppression layer is formed with the salicide suppression substance 110 and the spacer substance 112 in the non-salicide region B by removing the photosensitive film 114 left on the non-salicide region B. Sequentially, source/drain terminals 118 are formed on the salicide region A by injecting an impurity at the source/drain region using the gate electrode 106 and the spacer 116 as the mask. Here, the salicide suppression layer acts as the mask for blocking the injection of the impurity such that the source/drain is not formed on the non-salicide region B.

Figure 1E:
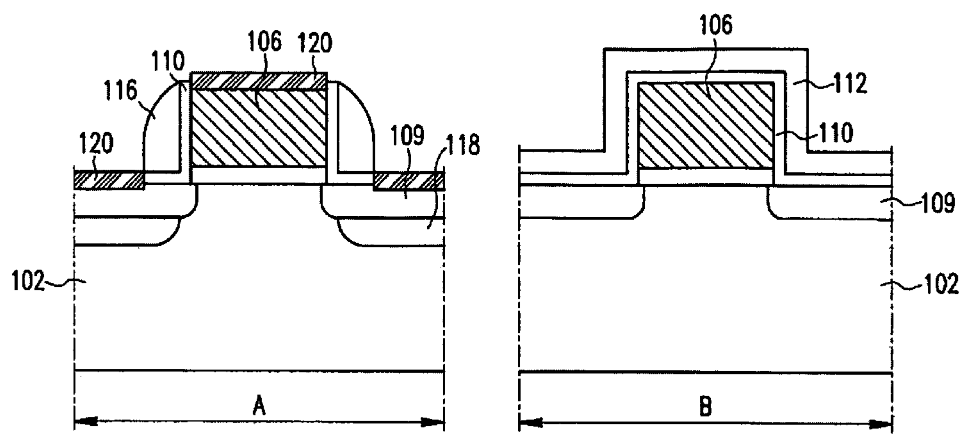
Figure 2A:
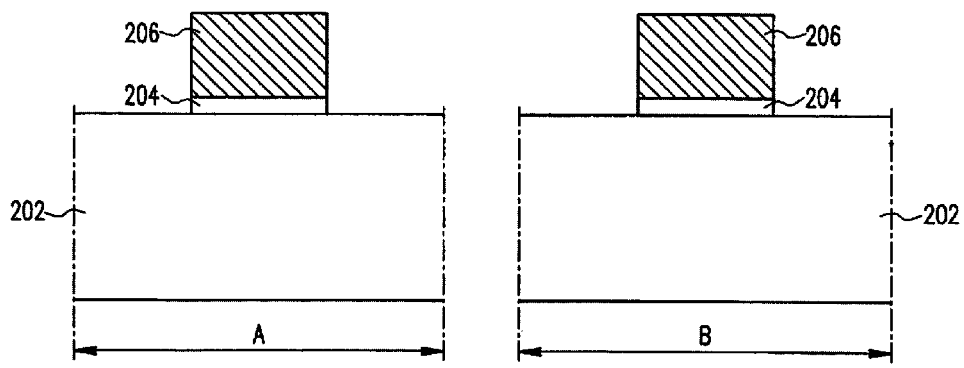
FIGS. 2A to 2F are drawings illustrating respective processes for fabricating a semiconductor device having salicide according to a conventional method.
Figure 2B:
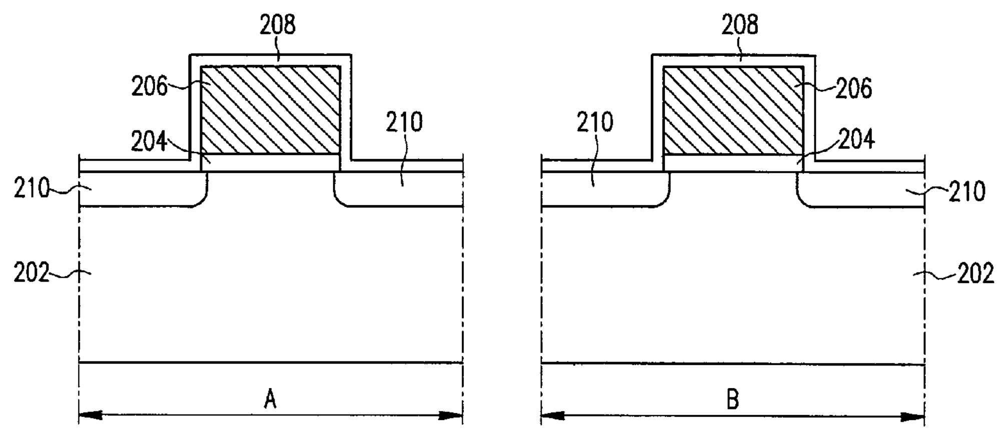
Figure 2C:
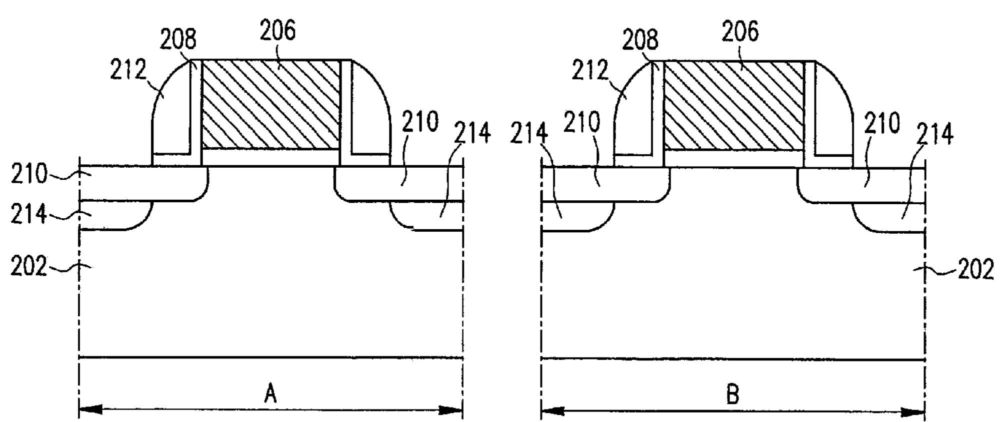
Figure 2D:
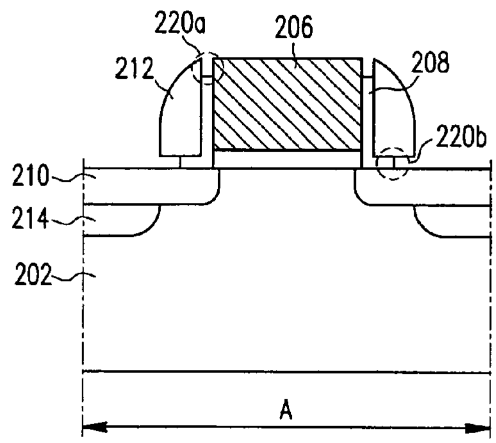
Figure 2D:
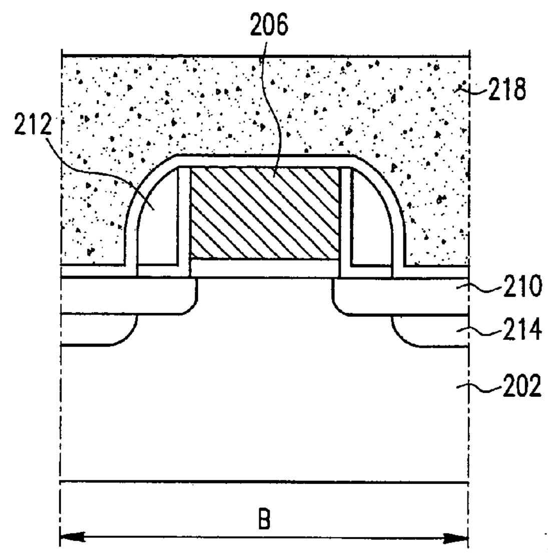
Figure 2E:
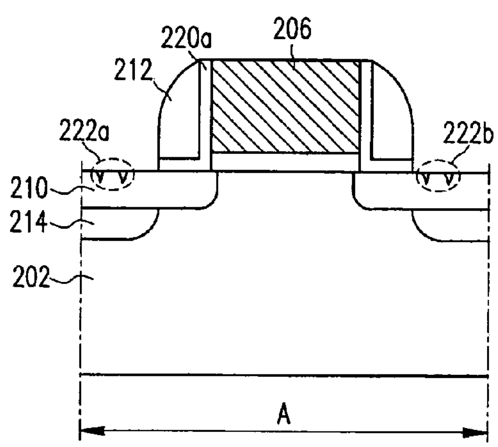
Figure 2E:
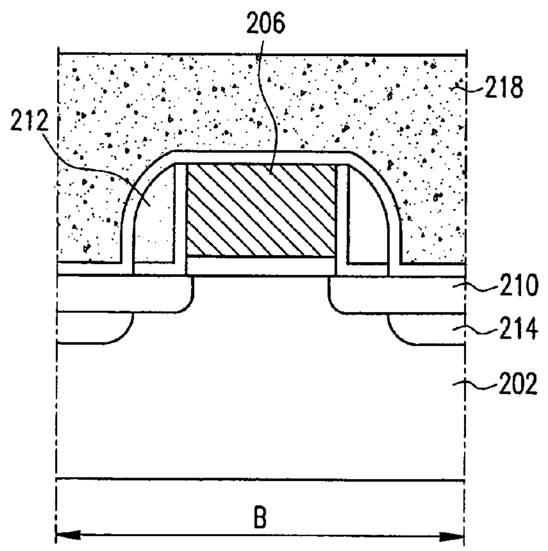
Figure 2F:
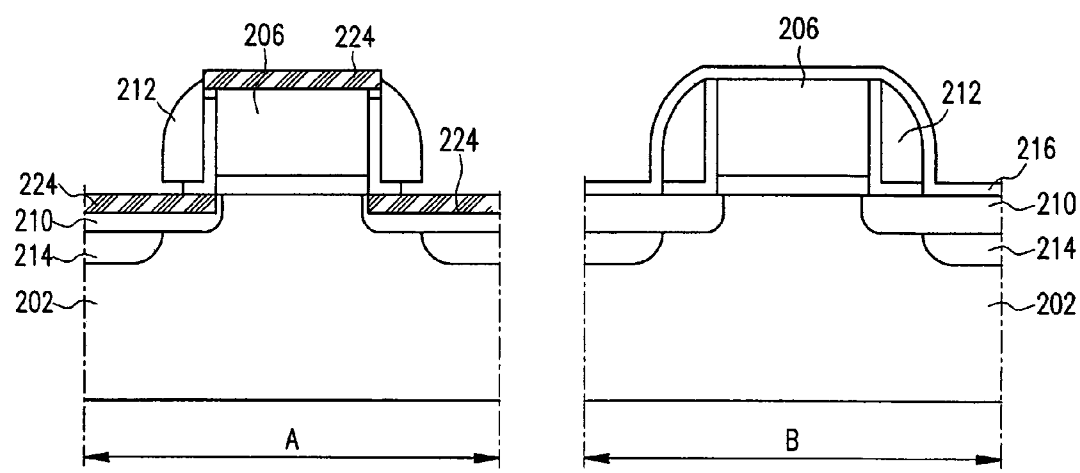

Next, as shown in FIG. 1E, a metal substance is formed on the entire surface of the semiconductor substrate 102, then the metal substance is salicided in the salicide region A by thermal annealing (e.g., fast or rapid thermal annealing) under predetermined process conditions. That is, the metal substance formed on the salicide suppression layers 110 and 112 in the non-salicide region B is kept, while the metal substance formed on and in contact with silicon (i.e., portions of the metal substance in the salicide region A) reacts with the silicon so as to be salicided, that is, the salicide 120 is formed on the upper surface of the gate electrode 106 and the upper surface of the low concentration impurity regions 109, as active regions. Thereafter, salicide suppression layers 110 and 112 can be removed from non-salicide region B, and conventional high- or low-energy, high- or low-concentration dopant/impurity implants can be performed in non-salicide region B (using a photosensitive film as an implant mask in salicide region A as needed) to form source/drain terminals, wells and/or "taps" (i.e., low impedance or low resistance electrical paths) for ESD protection and/or latch-up suppression or prevention.

As described above, unlike the conventional method in which the sidewall spacer of the gate electrode and the salicide suppression layer on the non-salicide region are formed through different etching processes, the salicide suppression layer and the sidewall spacer are formed at the same time through a single etching process after the salicide suppression substance of the silicon dioxide or the nitride film and the sidewall spacer substance of the nitride film or the silicon dioxide are sequentially formed in the present invention, such that it is possible to prevent an undercut effect from occurring at the spacer side during the etching process for forming the salicide suppression layer and to effectively prevent the surface of the semiconductor substrate from being damaged.

What is claimed is:

1. A method for fabricating a semiconductor device, comprising:

a. depositing a dielectric film spacer substance on an entire surface of the semiconductor substrate, said semiconductor substrate further comprising a salicide region and a non-salicide region, a gate oxide and a gate electrode on said semiconductor substrate in each of said salicide and non-salicide regions, and low concentration impurity regions in said semiconductor substrate adjacent said gate electrode;

b. forming an etch protection layer in said non-salicide region;

c. in the salicide region, etching the dielectric spacer substance to form a spacer on a sidewall of the gate electrode;

d. removing the etch protection layer to form a salicide suppression layer comprising the dielectric film spacer substance;

e. forming a metal salicide in the salicide region using a thermal annealing process; and thereafter f. forming one or more implants in said non-salicide region.

2. The method of claim 1, wherein the dielectric spacer substance comprises a first dielectric spacer layer and a second dielectric spacer layer thereon.

3. The method of claim 1, wherein the dielectric spacer substance comprises a nitride film.

4. The method of claim 2, wherein the first dielectric spacer layer differs from the second dielectric spacer layer.

5. The method of claim 1, wherein the dielectric spacer substance is formed at a thickness of approximately 1000 Å.

6. The method of claim 4, wherein the dielectric spacer substance is formed at a thickness of approximately 1000 Å.

7. The method of claim 2, wherein the first spacer layer is formed in a thickness range of approximately 100–350 Å, and the second dielectric spacer layer is formed in a thickness range of approximately 650–900 Å.

8. The method of claim 4, wherein the first spacer substance is formed in a thickness range of approximately 100–350 Å, and the second dielectric spacer substance is formed in a thickness range of approximately 650–900 Å.

9. The method of claim 7, wherein the first dielectric spacer substance is formed in a temperature range of approximately 650–730° C., and the second dielectric spacer substance is formed in a temperature range of approximately 700–800° C.

10. The method of claim 2, wherein the first dielectric spacer substance is formed in a temperature range of approximately 650–730° C., and the second dielectric spacer substance is formed in a temperature range of approximately 700–800° C.

11. The method of claim 1, further comprising forming said gate oxide and said gate electrode on said semiconductor substrate.

12. The method of claim 9, wherein said gate oxide consists essentially of silicon dioxide.

13. The method of claim 1, further comprising forming said low concentration impurity region(s) in the semiconductor substrate by ion injection using the gate electrode as a mask.

14. The method of claim 2, wherein one of the first dielectric spacer layer and the second dielectric spacer layer comprises one of a nitride film or silicon dioxide, and the other of the first dielectric spacer layer and the second dielectric spacer layer comprises the other of said nitride film or said silicon dioxide.

15. The method of claim 1, wherein the etch protection layer comprises a photosensitive film.

16. The method of claim 1, further comprising blanket depositing a metal substance over said semiconductor substrate prior to said thermal annealing process.

17. The method of claim 1, wherein the dielectric spacer substance is formed at a thickness of approximately 1000 Å or less.

18. The method of claim 3, wherein the dielectric spacer substance is formed at a thickness of approximately 1000 Å or less.

19. The method of claim 1, wherein the gate oxide, the gate electrode, and the low concentration impurity regions in said non-salicide region are part of an ESD protection circuit.

20. The method of claim 1, wherein said thermal annealing process comprises fast or rapid thermal annealing.

21. The method of claim 1, further comprising the step of forming, before said metal salicide forming step, source/drain terminals in and/or on said salicide region using said gate electrode and said spacer as a mask.

* * * * *